United States Patent
Lukoff (12)

(10) Patent No.: US 6,208,190 B1
(45) Date of Patent: Mar. 27, 2001

(54) MINIMIZING EFFECTS OF SWITCHING NOISE IN MIXED SIGNAL CHIPS

(75) Inventor: Arthur G. Lukoff, Allentown, PA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/321,002

(22) Filed: May 27, 1999

(51) Int. Cl.$^7$ ...................................... H03L 5/00
(52) U.S. Cl. ..................... 327/307; 327/361; 327/363
(58) Field of Search ................................. 327/307, 361, 327/362, 355, 310, 363

(56) References Cited

U.S. PATENT DOCUMENTS 5,841,308 * 11/1998 Nagata ................................. 327/307

* cited by examiner

Primary Examiner—Terry D. Cunningham
Assistant Examiner—Quan Tra
(74) Attorney, Agent, or Firm—Duane, Morris & Heckscher LLP

(57) ABSTRACT

An integrated circuit has a first circuit section and a second circuit section. The first circuit section has a local ground and is coupled to an external ground of a power supply for the first circuit section. The first circuit section adds an offset potential to the local ground potential when the first circuit section is on, due to an IR drop between the local ground and the external ground. The second circuit section has a signal-generating device and an offset correction circuit. The signal-generating device is referenced to the local ground potential and provides an output signal related to an input signal applied thereto. The offset correction circuit subtracts an offset adjust value from one of the input signal and the output signal to reduce offset error in the output signal caused by switching the first circuit section on and off.

10 Claims, 3 Drawing Sheets

100

100

300

320

MINIMIZING EFFECTS OF SWITCHING NOISE IN MIXED SIGNAL CHIPS

BACKGROUND OF THE INVENTION

1. Field of the Invention

The present invention relates to reducing the effects of digital circuit switching on sensitive circuitry and, in particular, to reducing the effects of the DC substrate offset produced by switching on and off digital circuit sections on sensitive analog circuit sections within the same integrated circuit.

2. Description of the Related Art

Integrated circuits (ICs) are typically formed in a manufacturing process on silicon wafers which provide a common substrate for the components of an IC. Several ICs are usually formed in each wafer, which is a very thin, flat disc typically about 8–12" in diameter at the present time. A group of ICs or wafers produced in a given manufacturing process are sometimes referred to as a "lot". During the manufacturing process, impurities are diffused into each silicon wafer to create transistors and other electronic components of the respective ICs of the wafer. These components are then interconnected through deposited metal layers to form logic or other functions. Once the wafer is completely processed, it is cut up into the individual die (chips), which are typically about ⅓" by ⅓" in size. Each die is mounted in a package and the terminals of the chip are connected to the package terminals through a wire bonding operation.

Each IC typically contains several distinct circuit portions or sections designed to perform various functions. So-called "mixed signal" ICs or chips provide both analog and digital circuit sections or functions on the same silicon die and thus on the common substrate in which they are formed. For example, a mixed signal IC may contain sensitive analog circuits such as op-amps, digital-to-analog converters (DACs) or analog-to-digital converters (ADCs), as well as a digital logic circuit section such as a digital signal processor (DSP). A typical mixed signal application, for example, involves taking an analog chip input and converting it to a digital word with an ADC. A DSP can then perform some complex mathematical algorithm on the digital representation of the analog data to create a digital output word. A DAC can then be used to convert the digital word from the DSP back to an analog signal, which is available at the chip output. The chip in this example may have unbalanced analog inputs and outputs on the order of hundreds of microvolts, in addition to digital control and data signals.

Because of the common substrate, various forms of noise can be communicated between circuit sections. The digital circuit sections typically generate more noise, and the analog circuit sections are typically more vulnerable to noise, primarily noise caused by the digital circuit sections. Digital circuits, for example, generate high frequencies and harmonics and other noise due, in part, to the sharp edges of the digital waveforms used for clock signals and the like. This digital circuit noise can be communicated to sensitive analog circuit sections through the common substrate and can adversely affect their operation.

One type of digital circuit noise is caused by switching a digital circuit or portion thereof on and off. This type of noise is sometimes referred to as digital switching noise. In a mixed signal IC, noise from the switching can also be communicated to analog circuit sections through the substrate. In addition to this type of noise, switching a digital circuit section on and off can introduce a DC offset into the substrate ground, causing the local substrate ground potential to fluctuate with respect to an external ground (the external ground which is the ground for the power supply of the digital circuit section being switched on and off). This can interfere with the operation of analog circuit sections, which produce output signals with reference to the local, substrate ground. This substrate or DC offset problem is described in further detail below.

Referring now to FIG. 1, there is shown a cross-sectional view of a mixed-signal integrated circuit (IC) 100. A circuit diagram illustrating the supply connections and resistances of IC 100 in further detail is shown in FIG. 2. As shown in FIG. 1, IC 100 comprises digital circuit and analog circuit sections, in a common P+ substrate. Input and output signals and power are connected from the package pins to the internal chip pins through several levels of interconnect. The signals, nodes, and resistances of IC 100 are labeled in FIGS. 1, 2 as follows: $G_{NDA}$ is the analog ground; $V_{DDA}$ is the analog supply voltage; $G_{NDD}$ is the digital ground; $V_{DDD}$ is the digital supply; $D_{SUB}$ is the digital circuit section substrate; $A_{SUB}$ is the analog circuit section substrate; $R_{CM}$ is the on-chip metallization resistance; $R_{BW}$ is the bond wire resistance; $R_{PKG}$ is the package lead resistance; $R_{EPI}$ is the P– epi layer resistance; and $R_{SUB}$ is the resistance of the substrate between $D_{SUB}$ and $A_{SUB}$.

The connection of the chip digital and analog grounds to the PC board ground is a significant junction. The PC board is the external device containing the power supply that powers the digital circuit section. The PC board also contains the external ground (PC board ground) referenced by circuitry on the PC board, which receives output signals from components such as the analog output of the analog circuit section of IC 100.

Between the digital ground on the chip ($G_{NDD}$) and the PC board ground there are several series resistances, as shown in FIG. 2. This includes the resistance of the on chip metallization ($R_{CM}$) the bond wire resistance ($R_{BW}$), and the resistance of the package lead ($R_{PKG}$). Of these three, the bond wire resistance $R_{BW}$ is generally the most significant. The same holds true for the connection of the analog ground ($G_{NDA}$) to the PC board.

Since both the digital and analog grounds $G_{NDD}$, $G_{NDA}$ are connected to the substrate, there is also some resistive path therebetween (i.e., $R_{EPI}+R_{SUB}+R_{EPI}$) through the shared substrate and the connecting epi layer portions. For a low resistivity substrate (which is common in today's IC processes) the digital and analog substrates, and hence the digital and analog grounds, are basically shorted together. Thus, the digital and analog circuit sections of an IC typically share a common, local ground.

Digital current ($I_{DIGITAL}$) flows through the resistance between the local (digital chip) ground $G_{NDD}$ and the external (PC board) ground when the digital circuit section is "on," i.e. receiving power from the digital power supply on the PC board. This current flow of current $I_{DIGITAL}$ causes a voltage differential (IR drop) to exist between these two points. This causes the potential of the digital substrate $D_{SUB}$ to rise with respect to the PC (external) board ground, when the digital circuit section is on, which in turn causes the potential of the analog substrate $A_{SUB}$ (analog ground) to rise by approximately the same amount. For a digital current of 80 mA, for example, the substrate rise, or digital switching offset, with respect to the PC board ground, can be approximately 4 mV. The digital switching offset is introduced, therefore, into the local analog ground $G_{NDA}$. Thus, any analog chip outputs, which are referenced to the analog chip ground $G_{NDA}$, will also rise by 4 mV with respect to the board ground.

This digital switching offset may be introduced and removed often because various DC circuit sections are often switched on and off. Digital circuits are frequently switched off (put to "sleep") to save power, and are turned on again ("awaken") when they are needed. This may be done, for example, if the device comprising IC 100 and the PC board is battery-powered, in which case power usage is very important. Each power switch (i.e., from off to on, or from on to off) of the digital circuit section will cause $D_{SUB}$ and the digital ground $G_{NDD}$, and thus $A_{SUB}$ and the analog ground $G_{NDA}$, to shift either up or down by the digital switching offset, due to the change in $I_{DIGITAL}$.

Thus, the local ground for analog circuit sections fluctuates with the digital switching offset each time the digital section is switched on or off. This change in the local ground potential by the offset amount in turn causes the analog outputs to shift by the approximately same amount (4 mV in the previous example).

Thus, this change in DC offset due to the digital circuit sections turning on and off can cause significant problems for the chip's analog inputs and outputs. For a 13 bit DAC output with a step size of 500 $\mu$V (0.5 mV) this 4 mV offset amounts to 8 steps (8 LSB) of error, a significant amount. This problem becomes more common and more severe as system integration increases the desirability of mixing digital and analog functions on the same chip. The unwanted changes in analog output signals as digital circuits are switched on and off can be viewed as a special type or manifestation of digital switching noise, and may be referred to as digital switching offset noise.

Various techniques have been proposed and utilized to attempt to isolate noisy digital circuit sections from sensitive analog circuit sections within the same IC, to reduce some or all of the various noise problems caused by digital circuitry in a mixed signal chip. Such techniques include isolation by physical separation; isolation by separate supply rails; isolation by grounded guard rings/substrate trenches; differential circuitry in the sensitive analog section; use of low noise injecting digital circuitry, such as current steering logic; making the digital circuitry sections synchronous with the analog function and moving the clock edges away from critical analog sampling instances. Such conventional techniques, however, are not always sufficient or fully effective, or practical, feasible, or cost-effective to implement.

Conventional approaches geared specifically to minimizing the effects of digital switching noise, including digital switching offset noise, in addition to the foregoing techniques, include: careful isolation of the digital and analog sections; disconnecting grounds carrying switching current from the substrate to reduce the noise coupled to the substrate; using more ground pins to minimize the noise on the substrate; and using differential I/O (input/output) on sensitive analog signals so the common mode noise is canceled. The results of the isolation approach is technology dependent. With some technologies (such as a triple well process) the isolation can be fairly well accomplished; but these technologies are expensive. However, with a dual well process on a low resistivity substrate (which is common for many of today's CMOS fabrication processes), sufficient isolation is difficult to achieve. Disconnecting the grounds to separate the substrate ground from the switching ground requires a different layout methodology. This is inefficient from both an area and layout time perspective. The last two approaches (additional ground pins and differential I/O) are quite effective, but require additional package pins, which are often at a premium.

SUMMARY

An integrated circuit has a first circuit section and a second circuit section. The first circuit section has a local ground and is coupled to an external ground of a power supply for the first circuit section. The first circuit section adds an offset potential to the local ground potential when the first circuit section is on, due to an IR drop between the local ground and the external ground. The second circuit section has a signal-generating device and an offset correction circuit. The signal-generating device is referenced to the local ground potential and provides an output signal related to an input signal applied thereto. The offset correction circuit subtracts an offset adjust value from one of the input signal and the output signal to reduce offset error in the output signal caused by switching the first circuit section on and off.

DESCRIPTION OF THE PREFERRED EMBODIMENT

The present invention addresses the aforementioned problems by providing a digital switching noise offset correction circuit in the analog circuit sections or elements to be protected from digital switching offset noise. In one embodiment, some or all of the digital switching offset is digitally subtracted from the digital input signal being applied to the analog circuit (e.g., a DAC) for which the effects of digital switching offset noise are to be minimized or reduced. As described more fully below, by selectively subtracting a given offset adjust or correction value from the digital data sent to the DAC only when the digital circuit section causing the offset is on, a substantial amount of the error otherwise introduced by the DC offset can be reduced. A significant advantage of the present invention is that no additional package pins are required. Additionally, the present approach may be used in conjunction with other noise-reduction techniques such as those described above.

In one embodiment of the present invention, a digital offset adjust value is subtracted from the digital input signal applied to an analog output device of the analog circuit section to minimize the erroneous change in output voltage signal otherwise caused by the change in the local reference ground. For example, in a mixed signal chip having a sensitive analog circuit section such as a DAC, and a digital circuit section, such as a DSP, a digital offset adjust value is digitally subtracted from the DAC conversion value before the value is applied to the DAC, as described in further detail below.

Figure 1:
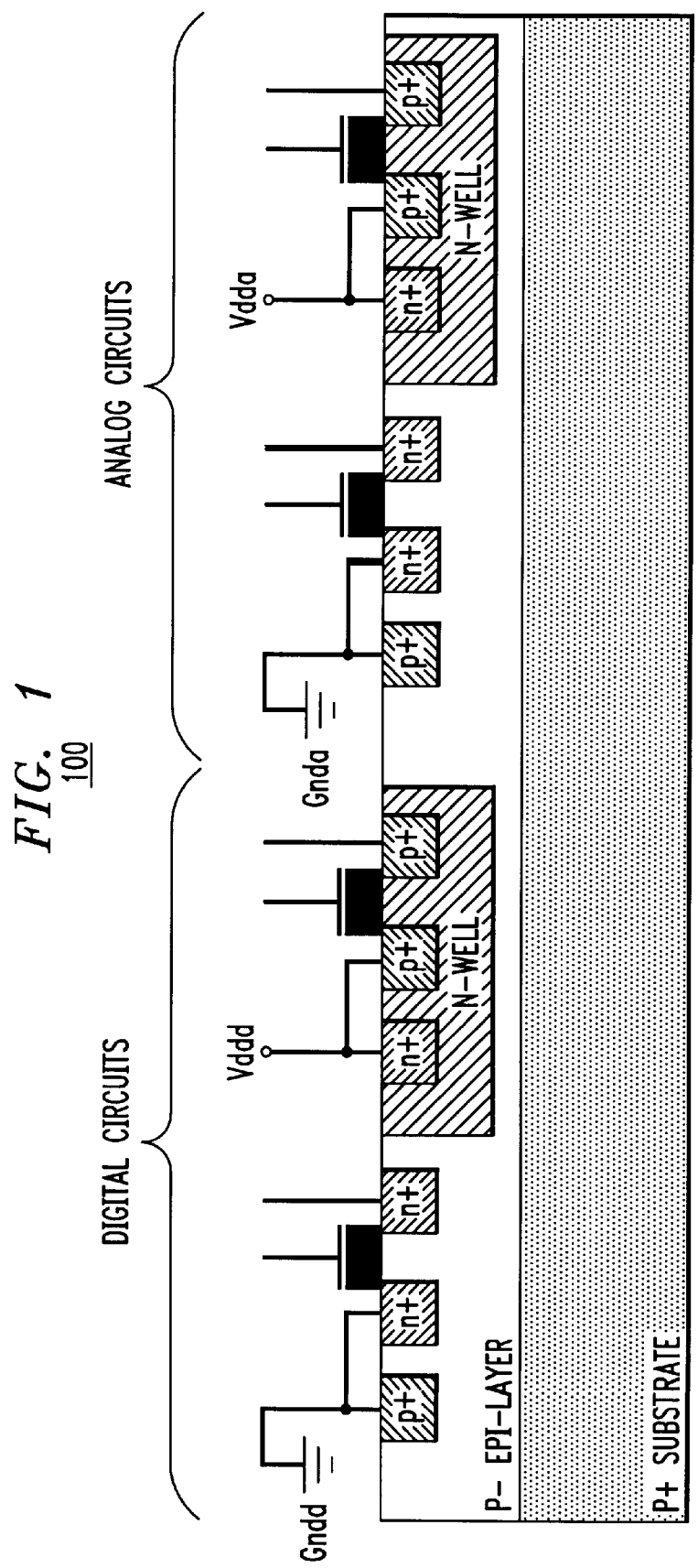
FIG. 1 is a cross-sectional view of a mixed-signal integrated circuit illustrating the DC substrate offset problem encountered due to digital circuit sections turning on and off.
Figure 2:
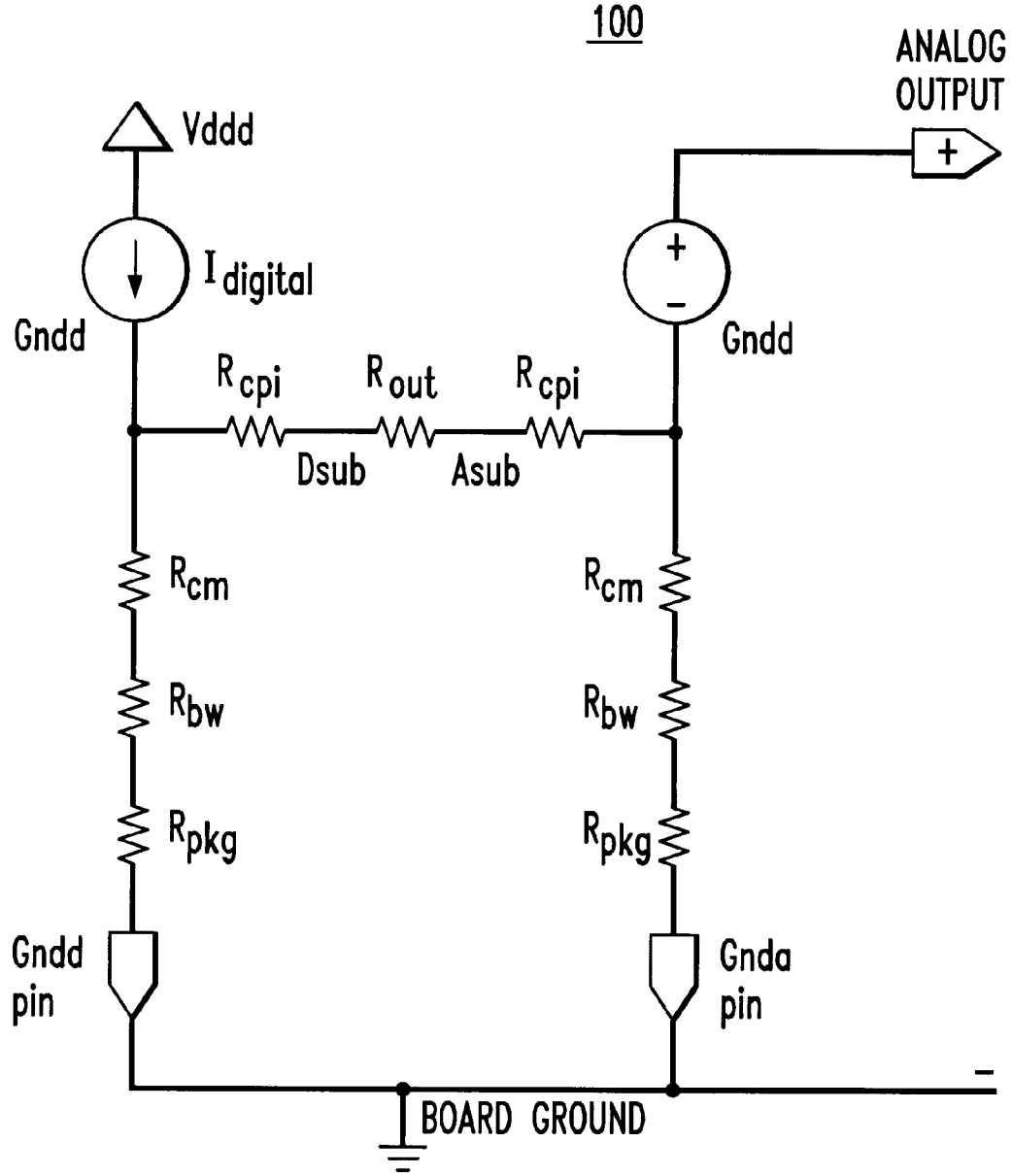
FIG. 2 is a circuit diagram illustrating the supply connections and resistances of the circuit of FIG. 1 in further detail.
Figure 3:
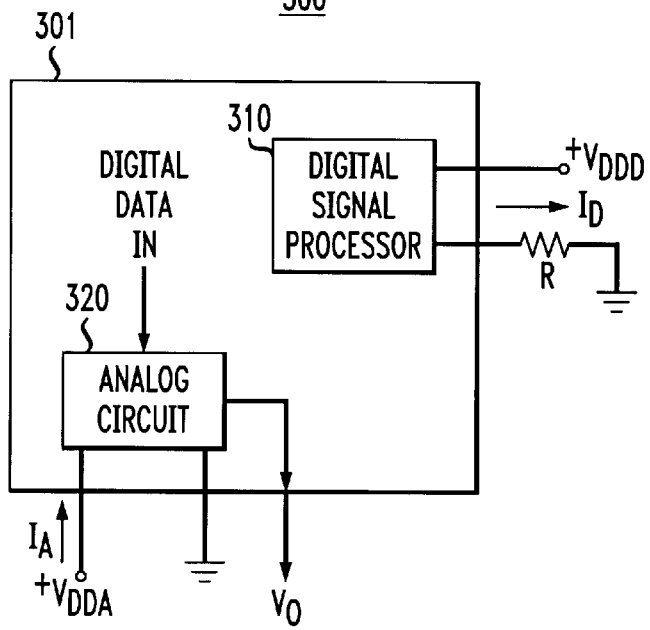
FIG. 3 is a block diagram of an integrated circuit (IC) having exemplary digital and analog circuit sections, in accordance with an embodiment of the present invention.

Referring now to FIG. 3, there is shown a block diagram of an integrated circuit (IC) 300 having exemplary digital and analog circuit sections 310, 320, in accordance with an embodiment of the present invention. The digital circuit section is a DSP 310, and the analog circuit section 320 contains a DAC. DSP 310 and analog circuit section 320 are formed within common substrate 301, which may be a dual well, low resistivity substrate. Analog circuit section 320 receives digital data in, which its DAC (410 of FIG. 4) converts to a corresponding output analog voltage $V_O$. This output analog voltage $V_O$ is referenced to the local ground (the substrate ground potential).

DSP 310 consumes a relatively large amount of current $I_D$, compared to the analog current $I_A$ used to power analog circuit section 320. As explained above, because of resistance R between the local or substrate ground of common substrate 301 and the external board ground, caused by bond wire and other resistance in the path, the local ground (the potential of substrate 301) is different from the board ground by up to 4 mV whenever DSP 310 is turned on. If not for the present invention, this would cause $V_O$ to change along with changes in the local reference ground, even if the input digital data is unchanged, leading to digital switching offset noise or error. As explained previously, a worst-case offset error of 4 mV may correspond to 8 LSB of error.

Figure 4:
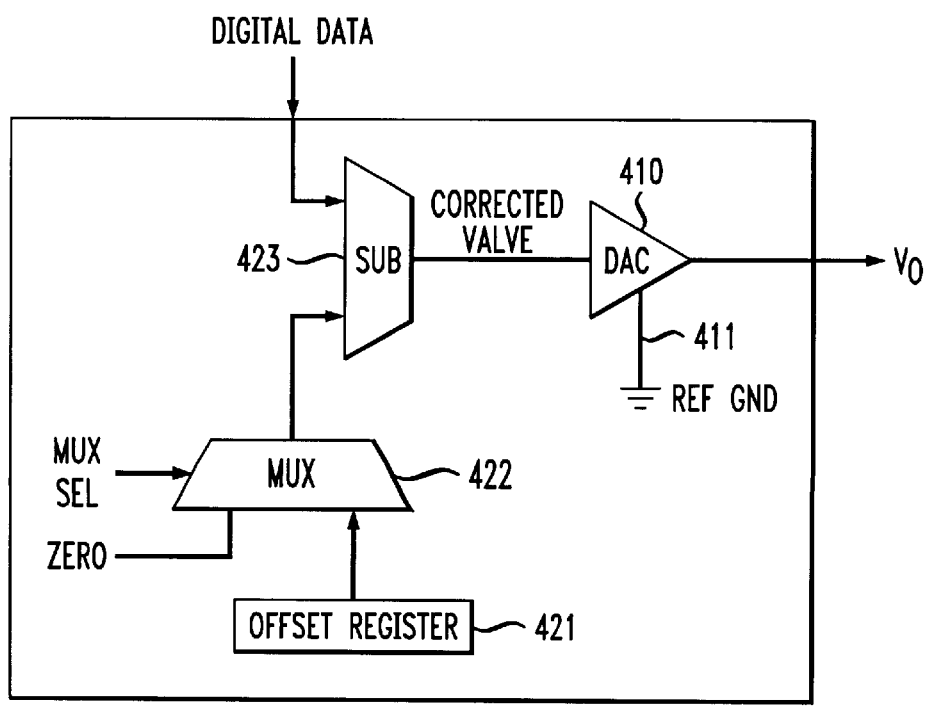
FIG. 4 is a circuit diagram of a digital switching noise correction circuit used by the analog circuit section of the IC of FIG. 3, in accordance with an embodiment of the present invention.

Referring now to FIG. 4, there is circuit diagram showing the analog circuit section 320 of FIG. 3 in further detail. Analog circuit section 320 comprises DAC 410, subtractor 423, multiplexer (MUX) 422, and offset register 421. DAC 410 has a ground terminal or rail coupled to the local reference ground, i.e. the ground potential of the die substrate common to both DSP 310 and DAC 410. In conventional systems, digital data in would be received directly by DAC 410 and the output signal $V_O$ would thus be prone to error due to the fluctuating substrate offset, as described previously. In the present invention, the value of the digital signal applied to the input of DAC 410 is modified to provide a corrected value at its input, to minimize the digital switching offset-induced error, i.e. to reduce digital switching offset noise.

Offset register 421 stores a digital offset adjust value corresponding to the amount of error introduced into $V_O$ when the local ground shifts by the digital switching offset, which is caused by DSP 310 being switched on. To determine the digital offset adjust value to use, the amount of local ground shift caused by DSP switching on needs to be determined. To do this, measurements are taken of a number of chips to determine the output signal error for various cases. For example, the worst-case (maximum) error corresponds to the DSP operating at full capacity, drawing the maximum operating current $I_D$. The minimum error would correspond to the ground shift caused by DSP 310 being on but having minimum activity, and thus drawing the minimum operating current $I_D$. For example, it may be determined that when DSP 310 is on, the chip ground rises by 4 mV with respect to the board ground, in the worst or maximum case, and by 2 mV in the minimum case; and that the error in output signal $V_O$ is 4 mV in the worst case and 2 mV in the minimum case. No local ground offset is present when DSP 310 is off.

Thus, an offset adjust value corresponding to any ground shift between 2 mV and 4 mV will reduce the error in $V_O$ if it is subtracted from the digital signal input to DAC 410 whenever DSP 310 is on. In one embodiment, the offset adjust value stored in offset register 421 is selected to be a value between the worst-case and best-case ground shift caused by DSP 310 when DSP 310 is running; preferably, the median value is selected, which is half-way between the two extremes. For maximum and minimum offset errors of 4 mV and 2 mV, for example, a digital offset adjust value corresponding to 3 mV of analog output voltage change $V_O$ may be used. In general, the offset error corresponds to the ground shift caused by turning the digital circuit section on, whether this is the median or average of the ground shift, or some other value in the range of ground shifts that can be caused by switching on the digital circuit section.

Thus, MUX 422 applies the contents of offset register 421 to the input of subtractor 423, so that subtractor 423 subtracts the selected offset adjust value from the digital data input signal whenever DSP 310 is on, thereby minimizing the offset error that would otherwise be introduced into $V_O$. (As will be appreciated, subtracting a positive offset adjust value is equivalent to adding a negative offset adjust value, and vice-versa.) To prevent the offset adjust value correction from being employed whenever DSP 310 is off, it is only applied when DSP 310 is switched on, and is not applied otherwise. Thus, in one embodiment, MUX 422 is used to select a zero, rather than the offset register value, to be subtracted from the digital data input signal. The MUX select signal may be derived from the enable or power on signal which causes DSP 310 to be switched on and off (awake and asleep).

In another embodiment, MUX 422 is not utilized, and a predetermined offset value is always subtracted from the input digital data. In this case, offset register 421 stores some offset adjust value designed to reduce the overall effects of digital switching noise error. For example, if a maximum offset introduced when DSP 310 is on is 4 mV, and if no offset is introduced when DSP 310 is off, then an offset adjust value half-way between these values (i.e., 2 mV) may be selected. This reduces the error when DSP 310 is on, but introduces an error into $V_O$ whenever DSP 310 is off. However, this may be advantageous because the maximum error is decreased from, say, 8 LSB in one direction, to 4 LSB in either direction.

The present invention has been described with reference to correcting for offset error introduced into the analog output signal of a DAC, which has a digital input. This embodiment of the present invention may be applied to any device having a digital input signal and an analog voltage output signal. In general, a DAC, an ADC, and other types of devices may be referred to as signal-generating devices. A signal-generating device receives an input signal, and generates (outputs) a generated (output) signal, which is related to the input signal. In alternative embodiments, the present invention may be employed with any signal-generating device of an analog circuit section, where at least one of its input or output signals is analog. (If both signals are digital, then the digital switching offset problem does not arise.) As will be appreciated, the output signal is output by the signal-generating device, and may be provided and used only internally to the IC (e.g., if the signal-generating device is on the "input" side of the IC), or may be output externally to the IC.

Thus, for example, the analog signal-generating device into which offset error is introduced is an ADC instead of a DAC. This is a device, typically on the input side of the IC, having an analog input signal and a digital output signal. In such a device, the input stage of the ADC is referenced to the local ground and the analog input signal is referenced to the external board ground, which gives rise to an offset error in the digital output signal. In both this case and the DAC case, described above, the signal-generating device has one of an analog or digital input signal, and the generated output signal is the corresponding other of a digital or analog generated output voltage signal. Whichever of the two signals is the digital one is corrected by digitally subtracting a digital offset adjust value therefrom. Where the signal-generating device is an ADC, the digital output signal which is generated by the device is corrected instead of the input being corrected. Thus, in this case, an analog input voltage signal is applied directly to the input of the ADC, and the digital output signal is applied to the input of a digital subtractor such as subtractor 423, which subtracts an offset adjust value from the raw output signal to provide a corrected output signal.

In both these cases—digital input and analog output; analog input and digital output—the offset adjust value is digitally subtracted from the digital signal, whether it be the input or output (generated) signal, when the digital circuit section causing the offset is on. As will be appreciated, one of the input and the output signals of the device is necessarily analog, because if both input and output are digital then the offset problem is not encountered.

In a further embodiment of the present invention, the analog voltage generating component to be protected from error does not have a digital input or output, but has an analog voltage input and output, such as an op amp or buffer. In this case, offset register 421 is an analog correction voltage, MUX 422 is an analog MUX, and subtractor 423 is an analog subtractor. In this case as well as in the ADC or DAC type cases, at least one of the input and output signals is analog; the other may be either digital or analog. Where the "other" signal is digital, digital correction of this signal (whether it is the output or input) is employed. Where both signals are analog, either the input or output signal is corrected with an analog offset adjust value.

In still another alternative embodiment, a separate offset register, MUX, and MUX SEL can be utilized to account for the ground shift effects of each of several digital circuit sections in the common substrate 301. If more than one such digital circuit sections is on, sharing a common ground connection and each having an independent offset adjust value corresponding to its own typical ground shift effects, which effect are cumulative, then the appropriate offset adjust values are applied as inputs to subtractor 423. Thus, for example, if two digital circuit sections are on, each of their offset adjust values are subtracted by subtractor 423 from the input signal. Alternatively, a single offset adjust value and offset register 421 may be employed, but any one of several digital circuit sections may independently turn on the MUX SEL line via an OR gate or similar logic, so that when any of the digital sections is on, then the predetermined offset adjust value is subtracted from the uncorrected digital input data signal.

In another embodiment, the value of the offset correction factor is not determined apriori and fixed and stored in offset register 421, but is rather determined dynamically, in real-time, by comparing the local ground to true (board) ground and setting the offset accordingly. In this case, MUX 422 is not needed, since when local ground is equal to true ground, this would cause the offset to automatically be set to zero.

Thus, in the present invention, an analog circuit section contains an output device component (e.g., a DAC, buffer, ADC) that outputs an analog or digital output signal, where the output signal is affected by changes in a local, reference ground applied to the component, and where the output signal is related to a digital or analog input signal. At least one of the input or output signals is analog. A digital switching noise correction circuit is employed to minimize this problem. An offset adjust value (which is either digital or analog, depending on whether at least one of the input and output signals is digital or not) is subtracted from the one of the signals to correct for the offset error. Where the input signal is digital and the output is analog, the offset adjust value is subtracted, when the digital circuit section is on, from the input. Where the output signal is digital and the input is analog, the offset adjust value is subtracted, when the digital circuit section is on, from the output. Where the input signal and output signals are both analog, the offset adjust value is analog and is subtracted, when the digital circuit section is on, from either the analog input or output signal.

In any case, the offset adjust value is selected so that the digital switching offset error or noise, introduced into the output signal due to changes in the local ground, is reduced. In one embodiment, the component is a DAC having a digital input and an analog output, and the offset adjust value is coupled to the subtractor by a MUX only when the digital circuit section causing the digital switching noise is on; and the offset adjust value is selected in accordance with the expected ground shift caused by the digital circuit section when it is on. In one embodiment, this offset adjust value is selected as the average of the offset adjust values corresponding to the best- and worst-case ground shifts when the digital circuit section is running.

In the present invention, the analog circuit section and the digital circuit section are coupled via a common substrate to a common local ground. In an alternative embodiment, the present invention may be employed to address an offset ground problem caused by a digital circuit section having a local digital ground which is coupled to a local analog ground of an analog circuit section, by a means other than a common substrate. For example, an analog circuit section in one PCB may be coupled the common local ground of the PC board, which is also the local ground for a second PCB having a digital circuit section. The digital circuit section can introduce an offset ground potential into the common local ground, when the digital circuit section is on, due to an IR drop between the digital circuit section and an external ground of a power supply of the digital circuit section.

It will be understood that various changes in the details, materials, and arrangements of the parts which have been described and illustrated above in order to explain the nature of this invention may be made by those skilled in the art without departing from the principle and scope of the invention as recited in the following claims.

What is claimed is:

1. An integrated circuit, comprising:
   (a) a first circuit section having a local ground and coupleable through a resistor to an external ground of a power supply for the first circuit section, wherein a power supply current flows through the resistance when the first circuit section is on, thereby causing an IR drop between the local ground and the external ground, whereby said IR drop introduces an offset potential to the local ground potential when the first circuit section is on; and
   (b) a second circuit section having a signal-generating device and an offset correction circuit coupled to either an input or output terminal of the signal-generating device, wherein the signal-generating device is coupled at a reference ground terminal to the local ground and is for providing an output signal related to an input signal applied thereto and the offset correction circuit is for subtracting an offset adjust value from either the input signal or the output signal to reduce an offset error in the output signal caused by switching the first circuit section on and off.

2. The integrated circuit of claim 1, wherein the offset correction circuit is for subtracting the offset adjust value from said one of the input signal and the output signal only when the first circuit section is on.

3. The integrated circuit of claim 2, wherein the offset adjust value is selected as a median value between a worst-case offset adjust value corresponding to an offset potential caused when the first circuit section is on and drawing a maximum operating current from the power supply, and a best-case offset adjust value corresponding to an offset potential caused when the first circuit section is on and drawing a minimum operating current from the power supply.

4. The integrated circuit of claim 1, wherein first circuit section is a digital circuit section and the second circuit section is an analog circuit section wherein at least one of the input signal and the output signal of the signal-generating device is an analog signal.

5. The integrated circuit of claim 1, wherein the input signal of the signal-generating device is a digital input signal and the output signal of the signal-generating device is an analog output signal.

6. The integrated circuit of claim 5, wherein the signal-generating device is a digital-to-analog converter.

7. The integrated circuit of claim 5, wherein the offset correction circuit comprises an offset register for storing the offset adjust value, a multiplexer coupled at a first input to an output of the offset register and at a second input to a zero signal and at a select input to a multiplexer select signal, wherein the multiplexer select signal causes the multiplexer to provide zero at an output of the multiplexer when the first circuit section is off and the offset adjust value when the first circuit section is on, and a subtractor coupled at a first input to the digital input signal and at a second input to the output of the multiplexer, wherein the subtractor subtracts the output of the multiplexer from the digital input signal to provide a corrected digital input signal to an input of the digital-to-analog converter.

8. The integrated circuit of claim 5, wherein the input signal of the signal-generating device is an analog input signal and the output signal of the signal-generating device is a digital output signal.

9. The integrated circuit of claim 5, wherein the input signal of the signal-generating device is an analog input signal and the output signal of the signal-generating device is an analog output signal.

10. The integrated circuit of claim 1, wherein the first circuit section and the second circuit section are formed within a common substrate.

* * * * *